United States Patent
Economikos et al.

(10) Patent No.: US 6,218,236 B1
(45) Date of Patent: Apr. 17, 2001

(54) METHOD OF FORMING A BURIED BITLINE IN A VERTICAL DRAM DEVICE

(75) Inventors: Laertis Economikos, Wappingers Falls, NY (US); Hussein Ibrahim Hanafi, Basking Ridge, NJ (US); Thomas Safron Kanarsky; Cheruvu Suryanarayana Murthy, both of Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/238,729

(22) Filed: Jan. 28, 1999

(51) Int. Cl.$^7$ ................................................ H01L 21/8242
(52) U.S. Cl. ..................... 438/249; 438/246; 438/563; 438/561
(58) Field of Search ..................... 438/301, 249, 438/246, 243, 561, 562, 563

(56) References Cited

U.S. PATENT DOCUMENTS

| | | | |
|---|---|---|---|
| 4,797,373 | * 1/1989 | Malhi et al. | 438/249 |
| 5,017,977 | 5/1991 | Richardson | 257/316 |
| 5,122,476 | 6/1992 | Fazan et al. | 438/241 |
| 5,362,665 | 11/1994 | Lu | 438/253 |
| 5,364,808 | 11/1994 | Yang et al. | 438/253 |
| 5,396,093 | 3/1995 | Lu | 257/306 |
| 5,438,009 | 8/1995 | Yang et al. | 438/253 |
| 5,468,980 | 11/1995 | Yang et al. | 257/306 |
| 5,482,883 | * 1/1996 | Rajeevakumar | 438/249 |
| 5,536,670 | 7/1996 | Hsue | 438/241 |
| 5,631,185 | 5/1997 | Kim et al. | 438/397 |
| 5,702,969 | 12/1997 | Lee | 438/239 |
| 5,753,551 | 5/1998 | Sung | 438/253 |
| 6,001,684 | * 12/1999 | Shen | 438/246 |

FOREIGN PATENT DOCUMENTS 61-287143 * 12/1986 (JP).

* cited by examiner

*Primary Examiner*—Michael Trinh
(74) *Attorney, Agent, or Firm*—Scully, Scott, Murphy & Presser; Joseph P. Abate, Esq.

(57) ABSTRACT

A method of forming a shallow outdiffused buried bitline in a vertical semiconductor memory device is disclosed which utilizes annealing and oxidation to drive-in and pile-up the dopant atom into an outdiffused region. The anneal/oxidation which is carried out at two different temperature ranges allows for fabricating buried bitlines having the lowest resistance as possible at a maximum dopant concentration, yet being formed near the surface interface of the vertical pillars. Semiconductor memory devices containing the outdiffused buried bitline regions are also disclosed.

14 Claims, 5 Drawing Sheets

METHOD OF FORMING A BURIED BITLINE IN A VERTICAL DRAM DEVICE

FIELD OF THE INVENTION

The present invention relates to a method of fabricating a semiconductor memory device, and more particularly to a method of fabricating an outdiffused buried bitline in a n-type vertical dynamic random access memory (DRAM) array. The buried bitline provided by the inventive method is an outdiffused region which has low resistance, high dopant concentration and a shallow penetration depth so as to avoid the floating body effect for such devices.

An n-type semiconductor memory device comprising the outdiffused buried bitline of the present invention is also provided herein.

BACKGROUND OF THE INVENTION

As semiconductor memory devices such as n-type DRAMs are being scaled down in dimensions, there is a continuous need to maintain a sufficiently high storage charge per capacitor unit area. In order to construct high density semiconductor memory devices in a reasonable sized chip area, the cell structures have changed from planar-type capacitors to either trench or stacked capacitors.

All efforts to increase capacitance without increasing planar area can be categorized into building three dimensional capacitor structures. Some examples of three dimensions capacitor structures existing in the art are trench capacitors and stacked capacitors. While solving the above problem of planar capacitors, trench capacitors and stacked capacitors have their own problems which limit their use and/or reliability.

One major problem associated with trench capacitors is that when the semiconductor memory device is beyond 16 Mbit the trench forming the capacitor region needs to be very deep. Technical problems and even theorized physical limitations in processing deep trenches are known. When the stacked capacitor approach is used to fabricate high density DRAMs, very complicated stacked capacitors are needed, such as fin structures and crown capacitors.

In recent years, in order to obtain denser arrays, smaller sized cells are required. This has led to trench capacitor devices wherein the transfer device is formed on a pillar below or above the capacitor. One major problem with these types of prior art trench capacitors is that the transfer device body is isolated from the substrate of the device. In other words, the body of the pillar (transfer device) is not continuous with the underlying substrate. The term "continuous" is used herein to denote that the middle region of the vertical transistor region is composed of the same material as the underlying substrate and thus in direct contact with the underlying substrate.

This isolation results in the device exhibiting the so-called floating body effect. As is known to those skilled in the art, devices that contain a floating body exhibit a higher degree of leakage than devices which do not have a floating body. This high degree of leakage results in decreased retention times for such devices; therefore such devices have limited use.

The above effects are created since prior art methods are unable to fabricate an outdiffused shallow junction region exhibiting the lowest possible resistance at the highest concentration of dopant material. In the prior art, a one step rapid thermal annealing (RTA) process is employed to form the outdiffused regions. While the prior art one step RTA is capable of forming a shallow penetration depth, it does not form an outdiffused region having the lowest possible resistance at the highest possible dopant concentration level. The formation of outdiffused shallow regions exhibiting the lowest possible resistance at the highest dopant concentration is of great importance in forming an outdiffused bitline structure having a continuous body.

In view of the above drawbacks with prior art methods, there is a continued need to develop new and improved methods of forming a shallow outdiffused buried bitline in a vertical semiconductor memory device which avoids the floating body effect observed with prior art vertical semiconductor memory devices, yet is capable of exhibiting the lowest possible resistance at the highest dopant concentration possible.

SUMMARY OF THE INVENTION

One object of the present invention is to provide a method of fabricating a buried bitline in a vertical semiconductor memory device such as a n-type array DRAM which eliminates the floating body effect observed with prior art vertical semiconductor memory devices.

Another object of the present invention is to fabricate a shallow outdiffused buried bitline that exhibits the lowest resistance (less than about 5 ohms/sq.) at the highest possible dopant concentration (greater than $5 \times 10^{19}/cm^2$).

These and other objects and advantages are achieved in the present invention by utilizing the inventive method wherein annealing and oxidation are carried out in two separate, distinct steps so as to achieve a high dopant concentration near the semiconducting surface of the pillar structure and to keep the dopant within less than 0.1 micrometers laterally from the semiconducting surface. It is emphasized that the prior art one step RTA is incapable of forming a shallow outdiffused region which has the lowest possible resistance at the highest possible dopant concentration level.

In one embodiment, the present invention provides a method of fabricating a shallow outdiffused buried bitline having a low resistance and a high dopant concentration in a vertical semiconductor memory device comprising the steps of:

(a) providing a structure having a dielectric layer on at least one surface of a p-type semiconducting material;

(b) forming pillar regions in said structure provided in (a) by etching trenches in said structure;

(c) forming a recessed liner in said trenches, wherein said recessed liner is composed of arsenic (As) or phosphorous (P) doped glass;

(d) forming a first oxide layer over the structure provided in (c);

(e) annealing the structure so as to diffuse, i.e. drive-in, said As or P from said recessed liner into said p-type semiconducting material and said pillar regions;

(f) optionally removing said first oxide layer and any recessed liner material remaining in said trenches;

(g) oxidizing the structure provided in (e) or (f) so as to form a second oxide layer lining said pillars and to cause pile-up of said dopant material in a region underlying said second oxide layer;

(h) removing said second oxide layer and optionally said first oxide layer and said recessed liner from said trenches; and (i) etching said p-type semiconducting material in said trenches so as to provide separate shallow outdiffused buried bitlines in said pillar regions, wherein said outdiffused buried bitlines extend from the pillars' sidewalls.

By annealing and oxidizing the structure in two distinct processing steps and at two distinct temperature ranges rather than one, the following occur: First, the annealing step, which is carried out at high temperatures (greater than 950° C.), drives As or P into the p-type semiconducting material and the separate oxidization step, which is carried out at lower temperatures than the annealing step (less than 950° C.), causes a snow-plow effect piling-up As or P in a region below the second oxide layer formed during oxidation. It should be noted that the low temperature oxidation step does not cause any drive-in of the dopant material, yet it is capable of forming a shallow junction having low resistance and a high dopant concentration.

In an optional embodiment of the present invention, the pillar regions formed in step (b) above are designed to have a starting dimension which is larger than the final desired dimension of the pillars. This embodiment takes into account that the oxidization step may result in some loss of the size of the pillar.

Another aspect of the present invention relates to a vertical semiconductor memory device which comprises a p-type semiconducting material; an array of cells having pillars formed on said p-type semiconducting material, said pillars being arranged in rows and columns, each of said pillars having an upper region doped with a n-type of impurity, a middle region doped with a p-type of impurity and lower regions outdiffused from the sidewalls of the pillar which are doped with As or P, said middle region being continuous with the p-type semiconducting material; and a gate region positioned adjacent to said pillars.

DETAILED DESCRIPTION OF THE INVENTION

Figure 1A:
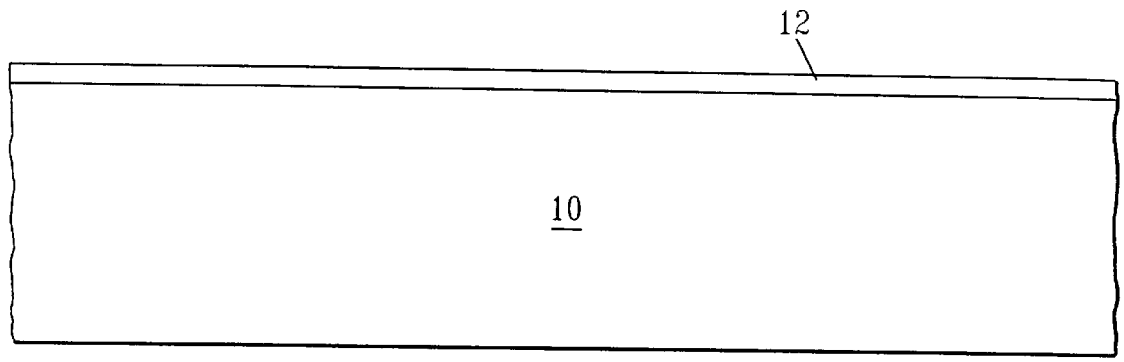
FIGS. 1(a)–(i) show the various processing steps that are employed in the present invention in forming a shallow outdiffused buried bitline in a vertical semiconductor memory device using a two step anneal and oxidation process.

The present invention, which provides a method of forming a shallow outdiffused buried bitline in a vertical semiconductor memory device, will now be described in greater detail by referring to the drawings that accompany this application. It should be noted that in the drawings like elements and components are referred to by like reference numerals. The term "shallow" is used herein to denote a region that is located within less about 0.1 micrometers from the surface of the semiconducting material.

Attention is first directed to FIG. 1(a) which is a cross-sectional view of the initial semiconducting structure utilized in the present invention. Specifically, the semiconducting structure shown in FIG. 1(a) comprises a p-type semiconducting material 10 having a dielectric layer 12 formed thereon.

Suitable p-type semiconducting materials employed in the present invention include: Si, Ge, SiGe, GaAs, InAs, InP and all other III/V compounds which are doped with a p-type dopant. Of these semiconducting material, it is highly preferred that semiconducting material 10 be composed of p-type Si.

Dielectric layer 12 may be composed of any conventional dielectric material including, but not limited to: $SiO_2$, $Si_3N_4$, polyimides, diamond, diamond-like carbon, silicon polymers, paralene polymers and fluorinated diamond-like carbon. Composites of the above described dielectric materials, containing one dielectric material on top of another, are also contemplated herein. A highly preferred dielectric employed in the present invention is a composite of $Si_3N_4$ and $SiO_2$, wherein the nitride is above the oxide.

Dielectric layer 12 is formed on at least one surface of p-type semiconducting material 10 utilizing oxidation and conventional deposition techniques well known to those skilled in the art. Examples of suitable deposition processes that can be employed in the present invention include: chemical vapor deposition, plasma enhanced chemical vapor deposition, sputtering, spin-on coating and other like deposition processes. While the thickness of the dielectric layer is not critical to the present invention, typical thicknesses for the same are from about 100 to about 200 nm.

The semiconducting structure shown in FIG. 1(a) may be subjected to a planarization process prior to forming the pillars in the semiconducting material. Any planarization technique known to those skilled in the art, such as reactive ion etching (RIE), chemical-mechanical polishing (CMP) or grinding may be employed herein.

Figure 1B:
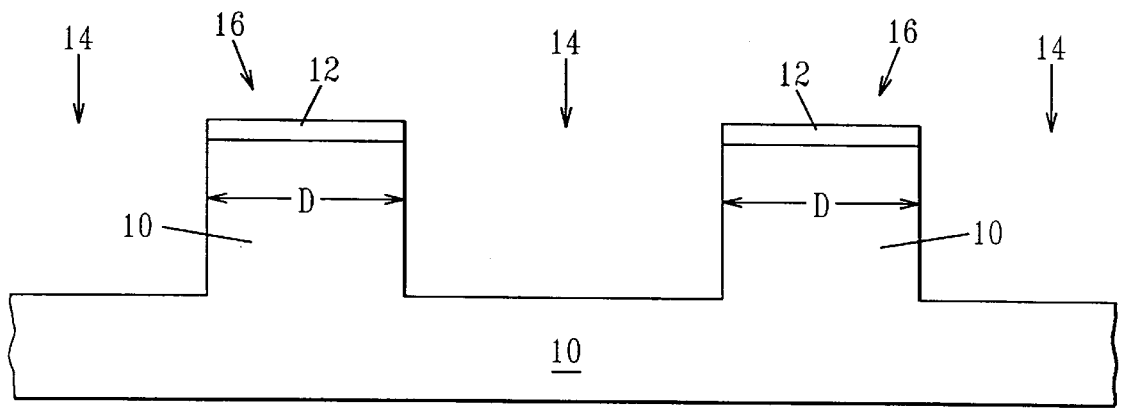

In accordance with the next step of the present invention, which is shown in FIG. 1(b), pillars 16 are formed in the semiconducting structure of FIG. 1(a). The pillars are formed in the present invention by removing predetermined areas of dielectric layer 12 and semiconducting material 10 so as to form trench regions 14. The trench regions are formed using conventional lithography and dry etching.

In one optional embodiment of the present invention, pillars 16 are designed such that they have a starting dimension, D, which is larger than the final desired dimension, D', of the pillar. That is, in this optional embodiment, the starting thickness of the pillars may be thicker than the ground rules of the device being manufactured.

Figure 1C:
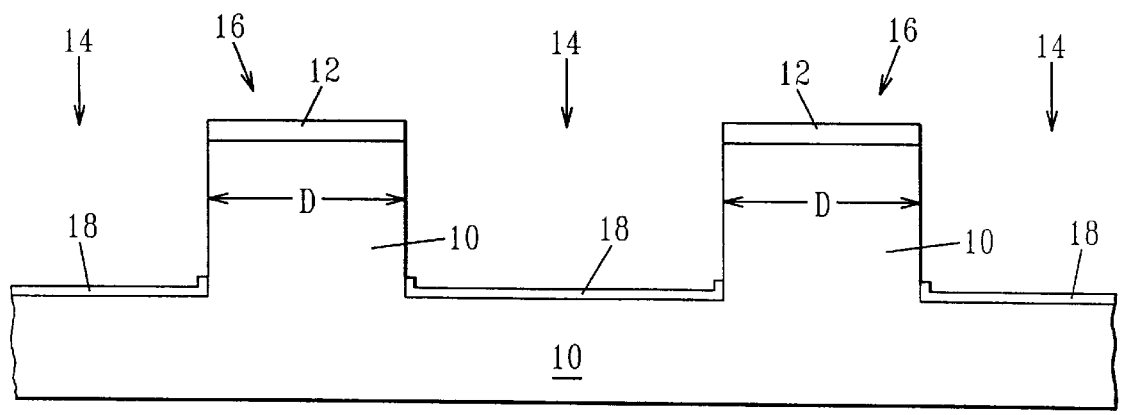

A recessed liner material 18 containing a dopant source material is then formed in trench regions 14. This step of the present invention is shown in FIG. 1(c). The recessed liner material is formed by depositing a layer of dopant source material onto the sidewalls and bottom portion of trench regions 14 utilizing conventional deposition processes well known to those skilled in the art. For example, chemical vapor deposition, spin-on coating, plasma vapor deposition and other like deposition processes may be employed. To ensure sidewall coverage, a directional RIE step may be employed in the present invention.

As stated above, the recessed liner material contains a dopant source. In the present invention, arsenic silicate glass (ASG) and phosphorous silicate glass (PSG) are employed since the same contain n-type dopant atoms, e.g. As and P, which can be diffused from the recessed liner into the pillars and underlying semiconducting material by annealing. Moreover, it has been observed that the dopant atoms As and P can be caused to pile-up under oxidation conditions which proceed annealing.

Recessed liner 18 is formed in the trench regions as follows: After depositing a layer of the dopant source material onto the sidewalls and bottom portion of the trench, the trench regions are filled with a conventional resist. Portions of the resist are then recessed using a dry etching technique such as RIE and then exposed portions of the layer of dopant source material are removed using a chemical etchant which is highly selective for ASG or PSG as compared to dielectric layer 12, semiconducting material 10 or the resist. Suitable chemical etchants that can be employed in the present invention in forming recessed liner 18 include: HF, HCl, HNO$_3$ and other like chemical enchant. Of these etchants, HF is highly preferred in the present invention to form recessed liner 18. After this step, the resist is removed using conventional stripping techniques well known in the art providing the recessed liner shown in FIG. 1(c).

Figure 1D:
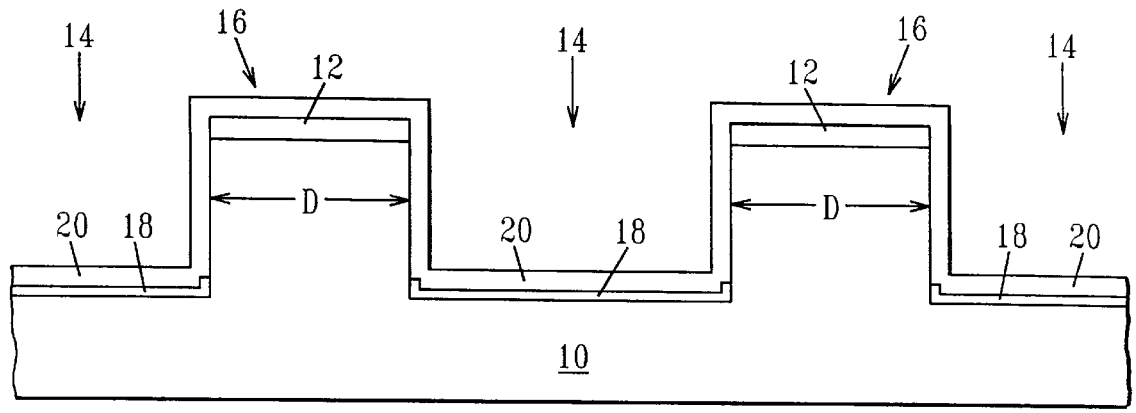

Next, as shown in FIG. 1(d), a first oxide layer 20 is formed over the entire surface of the structure shown in FIG. 1(c). This oxide layer may be composed of an oxide-containing material such as, but not limited to: SiO$_2$, tetra-ethylorthosilicate (TEOS), TiO$_2$, Ta$_2$O$_5$ and other like oxide-containing materials which are capable of preventing outdiffusion of the dopant material into undesirable areas during the annealing and oxidation steps of the present invention.

The first oxide layer is formed using conventional deposition techniques well known to those skilled in the art including: low pressure chemical vapor deposition (LCVD), plasma enhanced chemical vapor deposition (PECVD), sputtering and plating. The first oxide layer typically has a thickness of from about 5 to about 20 nm.

Figure 1E:
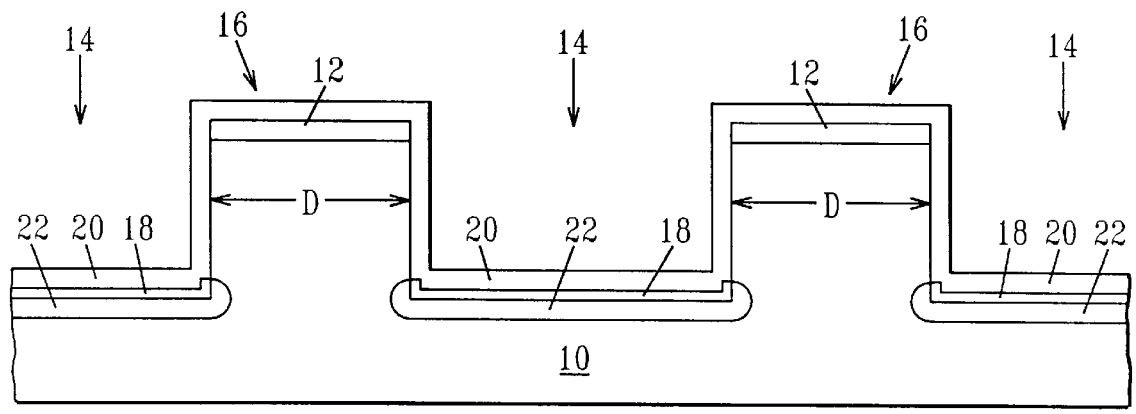

The structure shown in FIG. 1(d) is then subjected to high temperature annealing and low temperature oxidation so as to cause diffusion of the dopant material from recessed linear 18 into the semiconducting material and to cause pile-up of the dopant within the semiconducting material. In accordance with the present invention, the annealing and oxidation are conducted using a two step process, wherein high temperatures are employed in the annealing step to drive-in the dopant and low temperatures are employed in the oxidation step to pile-up the dopant in a new region. The structure containing outdiffused As or P regions 22 after annealing is shown in FIG. 1(e). It is emphasized that outdiffused regions 22 are unlike prior art outdiffused regions in that they have a high concentration of dopant, e.g. As or P, at the interface of the semiconducting material. The term "high concentration" is used herein to denote a concentration of As or P of greater than about $5 \times 10^{19}/cm^2$.

Figure 1F:
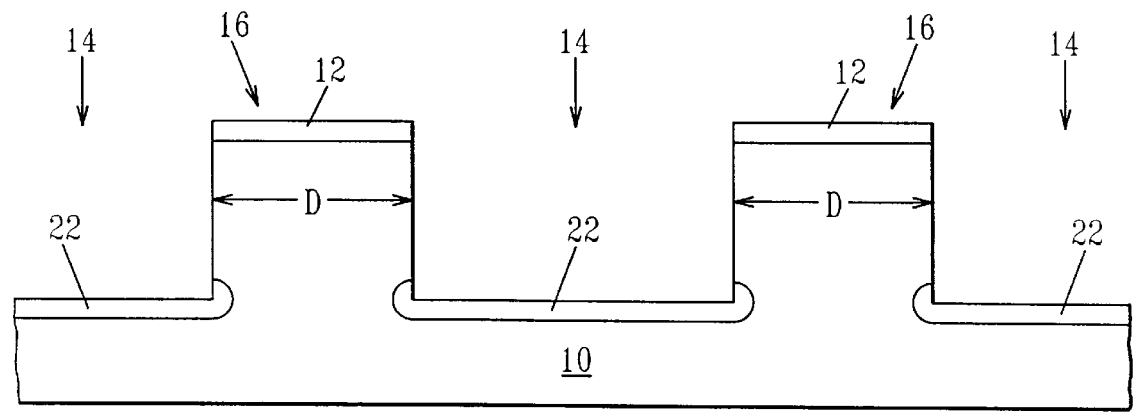

In the present invention, annealing is conducted first in one step and oxidation is performed in a later step. Recessed liner 18 and oxide layer 20 may or may not be removed prior to conducting oxidation. The structure shown in FIG. 1(f) is illustrative of the embodiment wherein layers 18 and 20 are removed prior to oxidation.

In the present invention, annealing is conducted using a rapid thermal anneal process that is carried out in an inert ambient such as Ar, He, N$_2$ or mixtures thereof at a temperature greater than 950° C. followed by a wet oxidation process which is carried out in steam or another oxygen-containing ambient at a temperature of less than 950° C. The low temperature oxidation step serves to increase, i.e. pile-up, the dopant concentration in the semiconducting material without further dopant drive-in thereby decreasing the junction depth while maintaining low resistance.

Preferably, annealing is carried out at a temperature of from about 1000° to about 1200° C. for a time period of less than about 2 minutes and the wet oxidation is carried out at a temperature of from about 700° to about 945° C. for a time period of less than about 5 minutes.

Figure 2A:
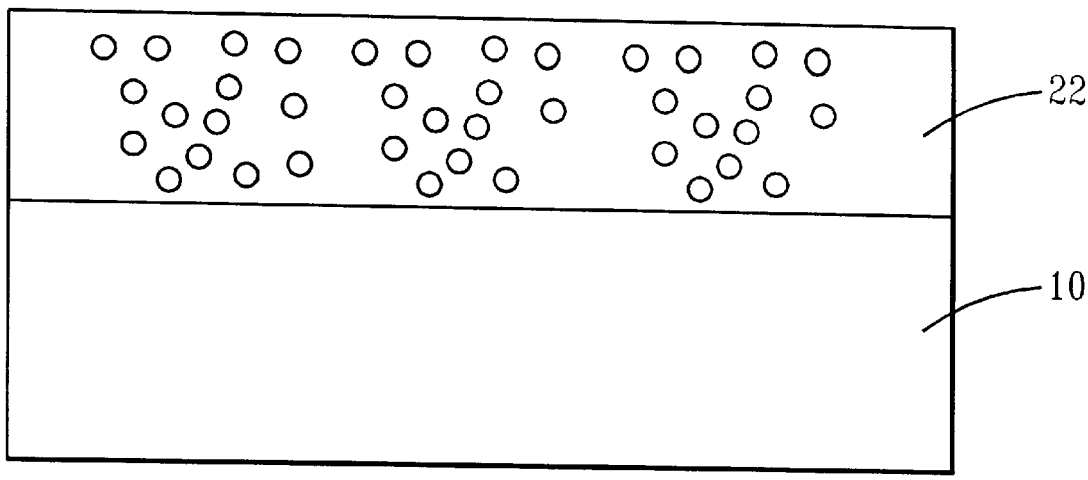
FIGS. 2(a)–(b) show the effects of the two step anneal and oxidation process employed in the present invention: (a) anneal step, i.e. drive-in step, and (b) oxidation step, i.e. pile-up step.
Figure 2B:
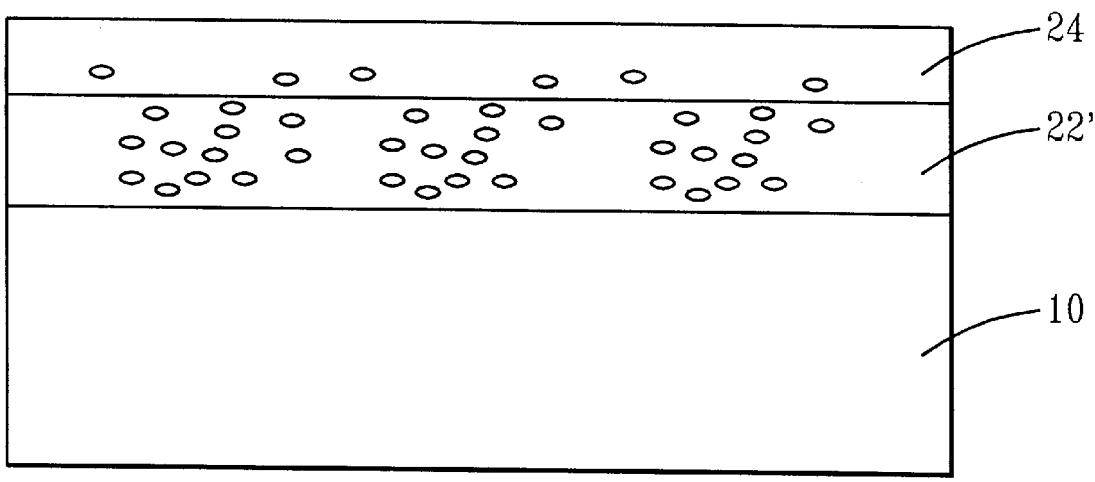

The effects of the separate annealing and oxidation steps employed in the present invention are illustrated in FIGS. 2(a) and (b), which illustrate enlarged views of FIGS. 1(e) and (g). As is shown in FIG. 2(a), the annealing conditions employed are sufficient to drive-in the dopant atoms into the semiconducting material, whereas in FIG. 2(b) oxidation causes a snow-plowing effect since the dopant atoms, As and P, do not like to segregate into an oxide layer formed during oxidation.

As stated above, first oxide layer 20 and recessed liner 18 may be removed prior to oxidation using conventional stripping processes well known to those skilled in the art, see FIG. 1(f). Specifically, conventional wet etching is employed to remove layers 18 and 20. A highly preferred technique employed herein for removing layers 18 and 20 is by utilizing a chemical etchant composed of HF.

Figure 1G:
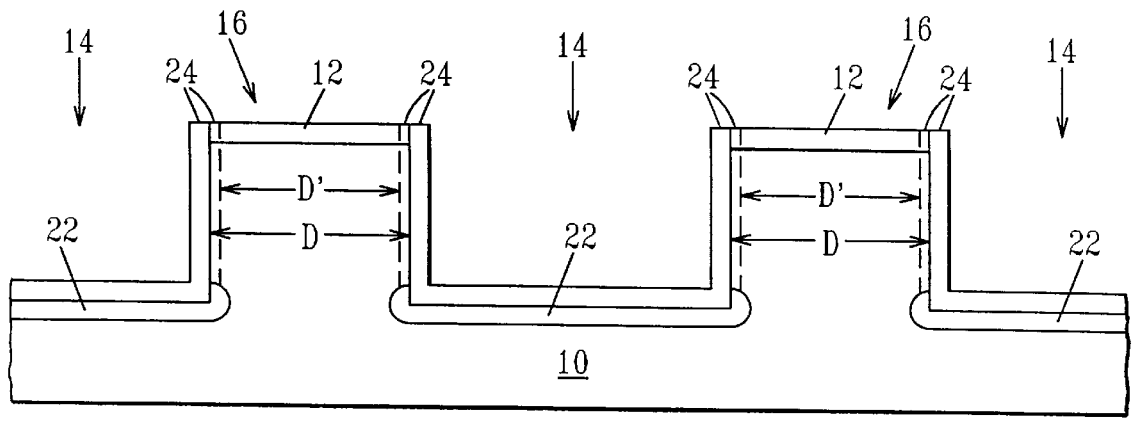

FIG. 1(g) shows the effects of the oxidation step mentioned above. As is shown, oxidation causes the formation of a thermal oxide layer 24 (hereinafter referred to as second oxide layer 24). As stated above, oxidation causes a snow-plowing effect piling-up the dopant material in an area beneath the thermal oxide layer.

Figure 1H:
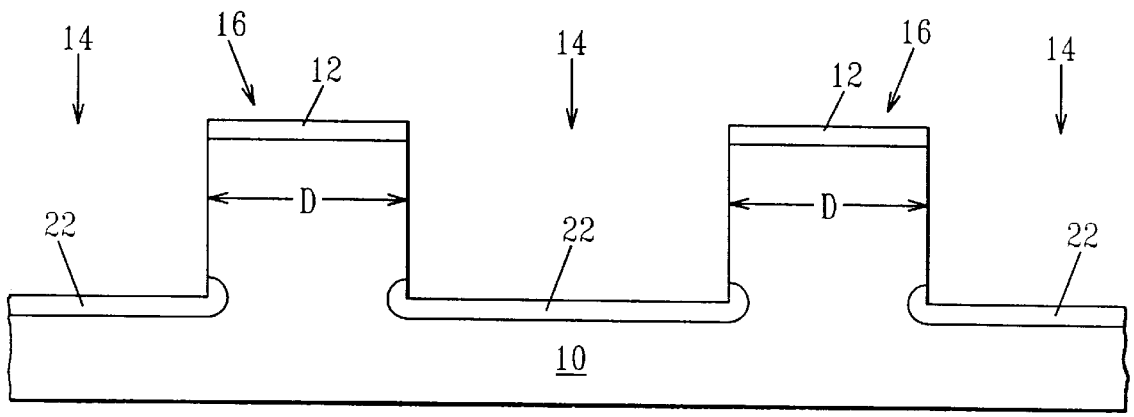

Next, as shown in FIG. 1(h), second oxide layer 24 is removed using conventional stripping techniques well known to those skilled in the art. Any conventional wet chemical etching process may be employed in the present invention. A highly preferred means for removing oxide layer 24 is by using HF as the chemical etchant.

It should be noted that in the optional embodiment wherein the starting pillar dimension is larger than the final desired size of the pillar, the above removal of oxide layer 24 provides a structure wherein pillar regions 16 have a final dimension, D', which is smaller than the starting thickness D. This embodiment of the present invention is shown in FIG. 1(g) by the dotted lines.

Figure 1I:
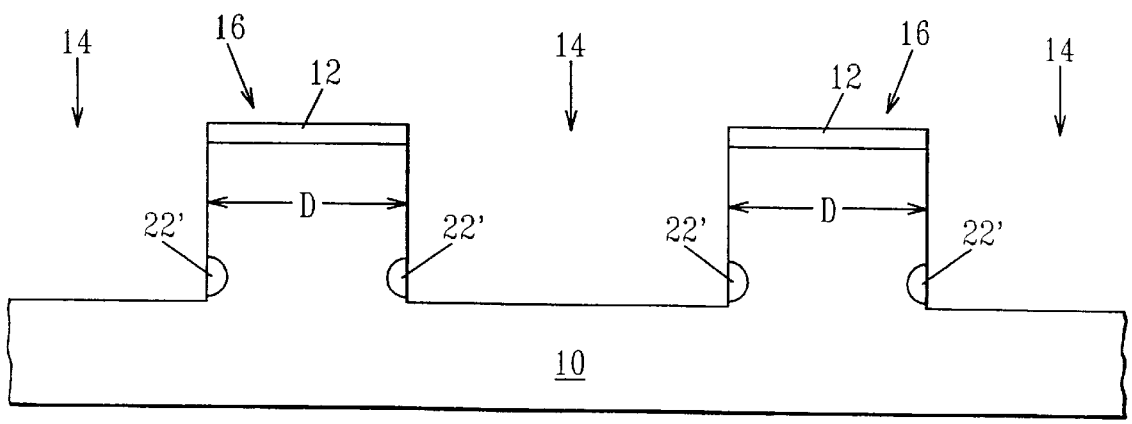

Next, as is shown in FIG. 1(i), outdiffused regions 22 are isolated by removing the semiconducting material below trench regions 14. This provides a semiconductor structure having separate shallow outdiffused buried bitlines 22' which are not joined in the middle region of the pillars. Moreover, as a result of annealing and oxidation, bitline regions 22' have a low resistance, yet have a high concentration of dopant atoms therein. Additionally, the bitline regions are formed near the surface of the pillars thereby avoiding the floating body effect normally associated with equivalent prior art structures.

Figure 3:
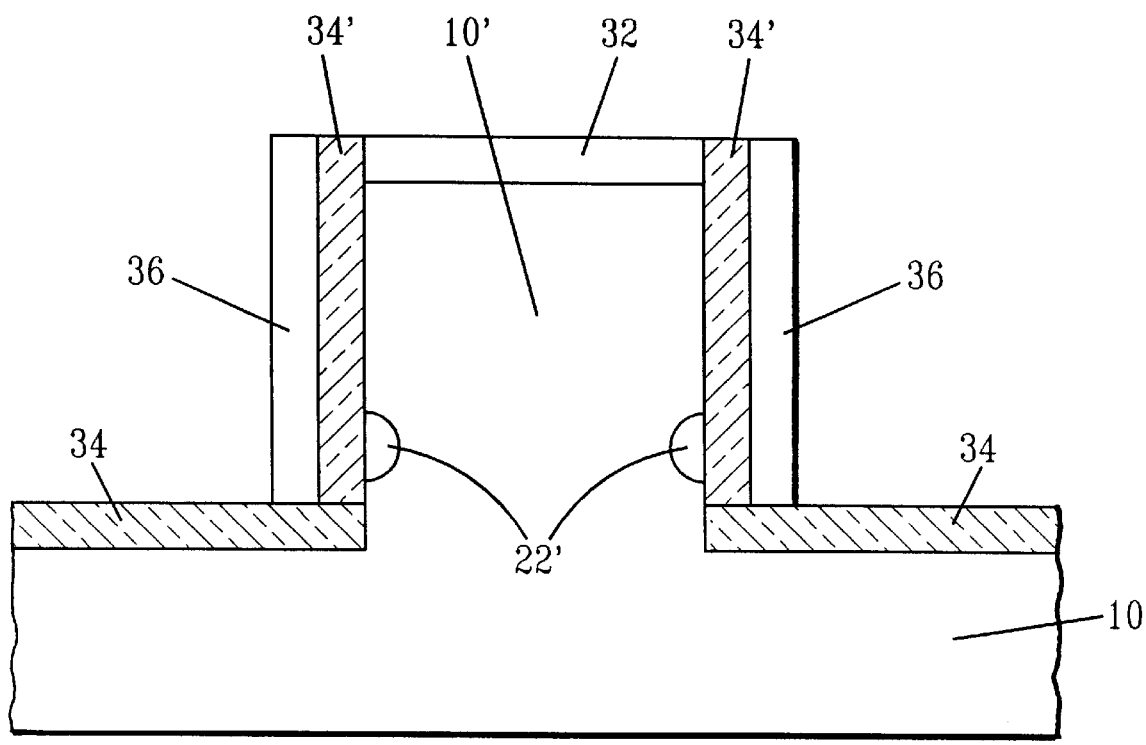
FIG. 3 is a cross-sectional view of a vertical semiconductor memory device that can be fabricated using the method of the present invention.

The structure shown in FIG. 1(i) may then be used in forming a semiconductor memory device such as shown in FIG. 3. The memory device of FIG. 3 includes an array of cells having pillars 16 which are arranged in rows and columns formed on a p-type semiconducting material 10. Each pillar 16 extends upward and has an upper region 30 doped with a n-type of impurity, a middle region which is continuous with said p-type semiconducting material 10 and a lower region 22' outdiffused from the sidewalls of the pillars. The memory device shown in FIG. 3 also includes a third oxide layer 34, gate oxide regions 34' and gate regions 36.

The semiconductor memory structure shown in FIG. 3 is fabricated first using the method of the present invention described above and then using conventional methods that are well known in the art in forming vertical semiconductor memory devices.

Specifically, third oxide layer 34 and gate oxide 34' are formed in the trench regions using thermal growing techniques or conventional deposition techniques such as chemical vapor deposition and plasma vapor deposition. Gate 36 is then formed by depositing doped polysilicon or another gate dielectric material on the sidewalls of gate oxide 34' using a direction RIE deposition process. Region 32 is then implanted into the structure using convention implantation techniques well known to those skilled in the art.

While the invention has been particularly shown and described with respect to preferred embodiments thereof, it will be understood by those skilled in the art that the foregoing and other changes may be made without departing from the spirit and scope of the present invention.

What is claimed is:

1. A method of forming a shallow outdiffused buried bitline in a vertical semiconductor memory device comprising the steps of:
   (a) providing a structure having a dielectric layer on at least one surface of a p-type semiconducting material;
   (b) forming pillar regions in said structure provided in (a) by etching trenches in said structure;
   (c) forming a recessed liner in said trenches, wherein said recessed liner is composed of arsenic (As) or phosphorous (P) doped glass;
   (d) forming a first oxide layer over the entire structure;
   (e) annealing the structure so as to diffuse As and P into said semiconducting material and said pillar regions;
   (f) oxidizing the structure provided in (e) so as to form a second oxide layer lining said pillars of said semiconducting material and to pile-up said As or P dopants in a region beneath said second oxide layer;
   (g) removing said first oxide layer, said second oxide layer and any remaining recessed liner from said trenches; and
   (h) etching said semiconducting material in said trenches so as to provide separate outdiffused buried bitline regions which are formed on the pillars' sidewalls.

2. The method of claim 1 wherein said p-type semiconducting material is composed of Si, Ge, Ga, As, InAs, InP or other III/V compounds which are doped with a p-type dopant.

3. The method of claim 1 wherein said semiconducting material is composed of p-type Si.

4. The method of claim 1 wherein said dielectric layer is composed of a dielectric material selected from the group consisting of $SiO_2$, $Si_3N_4$, a polyimide, a paralene, a silicon-containing polymer, diamond, diamond-like carbon, fluorinated diamond-like carbon and composites thereof.

5. The method of claim 1 wherein said dielectric layer is composed of a composite of $Si_3N_4$ and $SiO_2$.

6. The method of claim 1 wherein said trench regions are formed by lithography and dry etching.

7. The method of claim 1 wherein said first oxide layer and said recessed liner are removed prior to conducting said oxidation step.

8. The method of claim 7 wherein said pillars provided in (b) have a starting thickness which is greater than the thickness of the pillars after said oxidation step.

9. The method of claim 1 wherein said annealing step is carried out by rapid thermal annealing (RTA) in an inert ambient at a temperature greater than 950° C.

10. The method of claim 9 wherein said RTA is carried out in argon.

11. The method of claim 9 wherein said RTA is carried out at a temperature of from about 1000° to about 1200° C. for a time period of less than about 2 minutes.

12. The method of claim 1 wherein said oxidation step is carried out by wet oxidation using an oxygen-containing ambient at a temperature of less than 950° C.

13. The method of claim 12 wherein said oxygen-containing ambient is steam.

14. The method of claim 12 wherein said wet oxidation is carried out at a temperature of from about 700° to about 945° C. for a time period of less than about 5 minutes.

* * * * *